United States Patent
Nagata

(10) Patent No.: US 8,014,212 B2
(45) Date of Patent: Sep. 6, 2011

(54) SEMICONDUCTOR DEVICE AND CONTROL METHOD THEREOF

(75) Inventor: Shunya Nagata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 114 days.

(21) Appl. No.: 12/458,506

(22) Filed: Jul. 14, 2009

(65) Prior Publication Data

US 2010/0014360 A1    Jan. 21, 2010

(30) Foreign Application Priority Data

Jul. 17, 2008    (JP) ................................ 2008-186259

(51) Int. Cl.
  *G11C 7/00*    (2006.01)
(52) U.S. Cl. ................... 365/189.03; 365/205
(58) Field of Classification Search ............. 365/189.03, 365/205
See application file for complete search history.

(56) References Cited

U.S. PATENT DOCUMENTS

| 6,094,379 A | 7/2000 | Sago | |
|---|---|---|---|
| 2003/0020093 A1 | 1/2003 | Itaka | |
| 2006/0056253 A1 * | 3/2006 | Hosokawa et al. | 365/205 |

FOREIGN PATENT DOCUMENTS

| JP | 11-238381 | 8/1999 |
|---|---|---|
| JP | 2003-45190 | 2/2003 |

* cited by examiner

*Primary Examiner* — Michael T Tran
(74) *Attorney, Agent, or Firm* — McGinn Intellectual Property Law Group, PLLC

(57) ABSTRACT

Disclosed is a memory circuit that includes a plurality of columns of bit line pairs, each bit line pair including True and Bar bit lines, between which at least a memory cell is connected; a sense amplifier that has True and Bar terminals and that performs differential amplification; and a switching circuit that selects one of: a straight connection in which the True and Bar bit lines of a selected column bit line pair are connected to the True and Bar terminals of the sense amplifier, respectively; and a cross connection in which the True and Bar bit lines of a selected column bit line pair are connected to the Bar and True terminals of the sense amplifier, respectively.

9 Claims, 6 Drawing Sheets

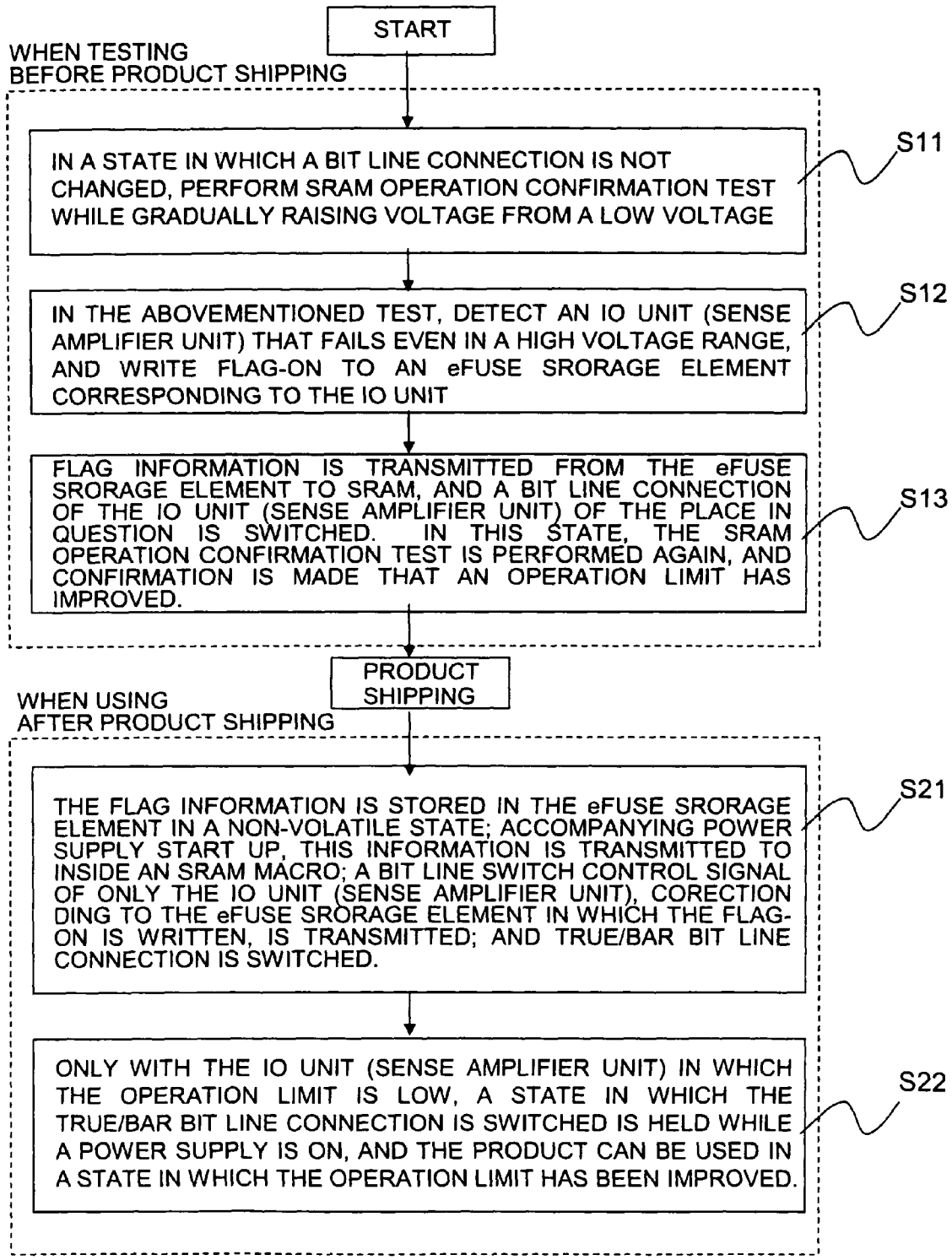

SEMICONDUCTOR DEVICE AND CONTROL METHOD THEREOF

REFERENCE TO RELATED APPLICATION

This application is based upon and claims the benefit of the priority of Japanese patent application No. 2008-186259 filed on Jul. 17, 2008, the disclosure of which is incorporated herein in its entirety by reference thereto.

TECHNICAL FIELD

The present invention relates to a semiconductor device, and in particular to a preferred configuration applied to a read circuit in a memory circuit and a control method of a semiconductor device comprising the memory circuit.

BACKGROUND

FIG. 5 is a diagram showing a typical configuration of a SRAM (static random access memory) circuit. As shown in FIG. 5, a SRAM memory cell 1 (configured as a flip-flop) is connected to True/Bar bit lines 4 (True/Bar bit line pair is denoted as "bit line (T/B)"), via access transistors (each access transistor is denoted also as "access Tr"). Each access transistor is composed by an N-channel MOS transistor that has a gate connected to a word line 3. True/Bar bit line pairs 4 are connected to True/Bar IO line pair 6 (True/Bar IO line pair is denoted as "IO line (T/B)"), via column selection circuits (Y selectors) 5 (also referred to as "Y switch") which are selected by a column decoder (not shown). Among a plurality of sets of bit lines (T/B) 4, one pair of bit line (T/B) 4 of a selected column, for which the column selection circuit (Y selector) 5 is turned on, is electrically connected to the IO line (T/B) 6. The word line 3 is driven to High by a word driver (not shown) which is connected to the word line selected by an X address decoder (not shown).

A sense amplifier 7 is differentially connected to the IO line (T/B) 6. Differential outputs of the sense amplifier 7 are supplied to a latch 8. Output (single ended output) of the latch 8 is connected to a RAM data output terminal. Although there is no particular limitation, in the example of FIG. 5, the latch 8 is composed by an SR latch including two 2-input NAND circuits that have respective inputs and outputs thereof cross-connected. That is, True and Bar IO lines 6 are connected respectively to first input terminals of first and second NAND circuits and outputs of the first and second NAND circuits are connected respectively to second input terminals of the second and first NAND circuits. There is provided a write buffer 9 that has an input (single ended input) connected to the RAM data input terminal and has outputs differentially connected to the IO line (T/B) 6. There are also provided P-channel MOS transistors P1 and P2 that have drains connected respectively to True and Bar bit lines 4, sources connected in common to a power supply (precharge power supply potential), and gates connected to a precharge control signal (Precharge). P-channel MOS transistors P1 and P2 compose a precharge circuit of the corresponding bit line (T/B) 4. There is also provided a P-channel MOS transistor P3 that is connected between True and Bar bit lines and that has a gate connected to the precharge control signal (Precharge). P-channel MOS transistor P3 composes an equalizer circuit of the bit line (T/B) 4. There is also provided P-channel MOS transistors P4 and P5 that have drains connected respectively to True and Bar IO lines 6, have sources connected in common to a power supply voltage (precharge power supply voltage), and have gates connected in common to a precharge control signal (Precharge). P-channel MOS transistors P4 and P5 compose a precharge circuit of the IO line (T/B) 6. There is also provided a P-channel MOS transistor P6 that is connected between True IO line and Bar IO line and has gate connected to the precharge control signal (Precharge). P-channel MOS transistor P6 composes an equalizer circuit of the IO line (T/B) 6. In the True and Bar IO lines 6, transfer gates (switches) TGT and TGB are inserted between connection nodes of column selection circuits (Y selectors) 5 that are provided at the ends of respective bit line pairs, and connection nodes between the differential outputs of the write buffer 9 and the True and Bar IO lines 6. Transfer gates TGT and TGB receives in common an inverted signal (a bar above Sense Enable indicates "inverted" version) of a Sense Enable signal controlling activation of the sense amplifier 7 and are on-off controlled based on the inverted signal of Sense Enable signal.

As shown in FIG. 5, the SRAM memory cell 1 includes a flip-flop including two inverters (not shown). Outputs of first and second inverters of the flip-flop are connected to inputs of the second and first inverters of the flip-flop, respectively. Since this configuration is well known, an internal configuration thereof is not shown in FIG. 5. The SRAM memory cell 1 of six transistors configuration, inclusive of two access transistors, includes two inverters, each of which includes a P-channel MOS transistor (load) that has a source connected to a power supply, and an N-channel MOS transistor (also referred to as a "drive transistor") that has a source connected to GND (ground), has a drain connected to a drain of the P-channel MOS transistor, and has a gate coupled to a gate of the P-channel MOS transistor. The coupled drains of the P-channel MOS transistor and the N-channel MOS transistor of the two inverters (that is, outputs of the two inverters) are connected respectively to one ends of the two access transistors 2, and coupled gates of the P-channel MOS transistor and the N-channel MOS transistor of respective ones of two inverter (that is, inputs of the inverters) are cross connected to the coupled drains of the P-channel MOS transistor and the N-channel MOS transistor of the other inverter (that is, outputs of the other inverters).

When data is read, a bit line pair is selected by the column selection circuit (Y selector) 5, and one pair of bit line (T/B) 4 of the selected column is electrically connected to the IO line (T/B) 6. Differential amplification of differential voltage between True and Bar bit lines 4 of the selected column is performed by the sense amplifier 7 that connected to the IO line (T/B) 6 and the sense amplifier 7 supplies differentially amplified result to the latch 8. Read data is delivered from the RAM data output terminal. With regard to an overall configuration of a clock synchronization type of SRAM, described below, reference is made to the description of Patent Document (FIG. 1 and the like), for example.

In a clock synchronous static memory circuit, a selected word line is raised to High level in synchronization with a clock to turn on access transistors 2 in a memory cell which have gates connected in common to the selected word line. As a result, one of a True bit line and a Bar bit line is pulled down to GND (ground) voltage in response to data held in the memory cell 1. That is, after True and Bar bit lines 4 have been precharged to a power supply voltage, one of True and Bar bit lines is discharged to GND voltage, via the access transistor 2 that is connected to the selected word line and set to an on state and a drive transistor (not shown) in an on state of the memory cell 1 connected between the access transistor 2 and GND. As a result, a voltage difference develops between the True and Bar bit lines 4 (the IO line (T/B) 6 electrically connected to the bit line (T/B) of the selected column). When a Sense Enable signal is in an activated state (for example in High level), the voltage difference between the True IO line and Bar the IO line is amplified differentially by the sense amplifier 7, as a result of which, data of the memory cell 1 connected to the selected bit line (T/B) 4 is read, and data latched by the latch 8 is delivered to the RAM data output terminal.

When the Sense Enable signal is Low, the transfer gates TGT and TGB that are on-off controlled by an inverted signal of the Sense Enable signal, are set to an on state and hence respective potentials of bit line (T/B) 4 selected by the column selection circuit 5 (Y selector) are transferred to the sense amplifier 7 on the IO line (T/B) 6. When the Sense Enable signal is High, the sense amplifier 7 performs a sense amplification operation and the transfer gates TGT and TGB are both set to an off state to disconnect IO line (T/B) 6 from the bit line (T/B) 4 of the selected column. In a state in which the IO line (T/B) 6 are disconnected from the bit line (T/B) 4, the sense amplifier 7 performs differential amplification of potentials of the IO line (T/B) 6 to which the potentials of the bit line (T/B) 4 of the selected column have been transferred.

The precharge control signal (Precharge) is set to Low before the selected word line is raised and the P-channel MOS transistors P1, P2 and P3 are turned on. P-channel MOS transistors P1 and P2 perform precharging of the bit line (T/B) to the power supply voltage and P-channel MOS transistor P3 performs equalizing of the bit lines (T/B) 4. Precharging and equalizing operation is carried out also for the IO line (T/B) 6, in the same way (at the same timing) as the bit line (T/B) 4 by the P-channel MOS transistors P4, P5 and P6 which are turned on by the precharge control signal (Precharge).

[Patent Document 1]
JP Patent Kokai Publication No. JP-A-11-238381
[Patent Document 2]
JP Patent Kokai Publication No. JP-P2003-45190A

SUMMARY

A following analysis is given by the present invention.

Recently, with the advancement of miniaturization technologies in semiconductor fabrication, dimensions of transistors have being reduced (for example, beginning of 60 nm era, in which gate length is of 60 nm). Operation limits of memory circuits are dependent to a large extent on random variations of transistors due to fabrication processes. Increase in variations is responsible for deterioration in yield rate.

In order to avoid yield rate deterioration in memory circuits, it becomes necessary to delay activation timing of a sense amplifier, for example. As a result, a characteristic (such as speed performance) in a memory circuit such as access time might be deteriorated.

A worst condition of an operation limit point in a read operation of the memory circuit is determined by multiplication of cell current of a memory cell and operation performance of a sense amplifier (this conclusion is based on analysis by the present inventor).

That is, in the memory circuit shown in FIG. 5, an operation limit point becomes lowest in read operation, when the read operation is performed for a combination of a memory cell (bit line pair) and a sense amplifier which correspond to the following two conditions of:
(A) a cell current (drive current of a drive transistor) of the memory cell is worst; and
(B) amplification performance of the sense amplifier is worst.

Therefore, the operation limit for the entire memory circuit is restricted by a worst operation limit point at which the memory cell and the sense amplifier correspond simultaneously to the two conditions of:
(A) the cell current of the memory cell is worst, and
(B) the amplification performance of the sense amplifier is worst. For example, referring to FIG. 5, in case drive performance of a drive transistor (not shown) of a memory cell connected via an access transistor 2 to a True bit line 4 of a second column from the left, is worst, and amplification performance of a True side circuit connected to an True IO line 6 of a differential circuit of a differential sense amplifier 7, is worst, even when drive performance of a drive transistor of the memory cell connected via an access transistor 2 to the Bar bit line 4 is good, and amplifier performance of a Bar side circuit connected to a Bar IO line 6 of a differential circuit of the differential sense amplifier 7, is good; and furthermore even when all the other columns are good, the operation limit as the entire memory circuit is restricted to a combination of the worst memory cell and worst sense amplifier.

When random variations of transistors are large, influence of effects of the memory cell being worst and the sense amplifier being worst becomes large, and hence an operation margin of the entire memory circuit gets narrowed. For example, a Fail region in a Shmoo plot increases and a Pass region (operation region) decreases. This results in deterioration of yield rate and speed performance.

Variations in adjacently placed transistors have been actualized in recent miniaturized fabrication processes and large variations in adjacent transistors result in cutting the operation limit to incur deterioration in yield rate and speed performance.

Patent Document 2 discloses a configuration shown in FIG. 6, in which, in order to cancel an offset of a sense amplifier, output data (offset) of the sense amplifier is cross-connected to be transferred to a latch circuit on a bit line pair. In FIG. 6, an equalizer circuit 12 is connected between input nodes N1 and bN1 of a differential sense amplifier 11. A latch circuit 13 is connected between nodes N2 and bN2. A data switching circuit 14 is connected between the nodes N1 and bN2 and between the nodes bN1 and N2. A cut-off circuit 15 is connected between the nodes N1 and N2 and between the nodes bN1 and bN2. When the differential sense amplifier 11 has an offset, after voltages of the nodes N1 and bN1 are made equal to each other by the equalizer circuit 12 in an offset check cycle, the differential sense amplifier 11 is operated and output data (offset information) of the differential sense amplifier 11 is latched by the latch circuit 13. A that time, an offset check signal OC is set to High (bOC is set to Low), the data switching circuit 14 electrically connects the node N1 to the node bN2, and electrically connects the node bN1 to the node N2, and the cut-off circuit 15 electrically disconnects the node N1 from the node N2, and electrically disconnects the node bN1 from the node bN2 (a sense amplifier enable signal SAEN is set High). Output data of the node N1 is transferred to the node bN2, and output data of the node bN1 is transferred to the node N2, and data obtained by inverting output data of the differential sense amplifier 11 is latched by the latch circuit 13.

After that, the offset check signal OC is set to Low, the data switching circuit 14 electrically disconnect the node N1 from the node bN2, and electrically disconnect the node bN1 from the node N2, and the cut-off circuit 15 electrically connects the node N1 to the node N2, and electrically connects the node bN1 to the node bN2 (the sense amplifier enable signal SAEN is Low). Output data of the node N2 is transferred to the node N1, and output data of the node bN2 is transferred to the node bN1. Data having a value opposite to a value of the output data of the differential sense amplifier 11, that is, data that reduces the offset is supplied to the differential sense amplifier 11.

As described above, the circuit in FIG. 6, performs switching of outputs (True, Bar) of the differential sense amplifier 11, and delivers data obtained by inverting the offset of the differential sense amplifier 11 to the latch circuit 13 on the bit lines. However no consideration at all is made to the above discussed problem regarding variations in the memory cell. For example, the circuit shown in FIG. 6 is configured such that, in normal reading, read data (complementary data) of the memory cell output on the bit lines is transferred to the nodes N1 and bN1 on the sense amplifier 11 via P-channel MOS transistors QP6 and QP7 that are set to an on state when the sense amplifier enable signal SAEN is Low. In this case, the nodes N2 and bN2 of the bit line pair are connected respectively to the nodes N1 and bN1 of the sense amplifier. That is, in the circuit configuration of FIG. 6, no measure is implemented with regard to a worst operation limit affecting the operation limit of the entire memory circuit, under the condition that the memory cell is worst and the sense amplifier is worst (This is derived by analysis by the present inventor).

The present invention, which seeks to solve one or more of the above described problems, is summarized as follows.

In one aspect of a device of the present invention, there is provided a memory circuit a plurality of columns of bit line pairs, each bit line pair including True and Bar bit lines, between which at least a memory cell is connected; a sense amplifier that has True and Bar terminals and that performs differential amplification; and a switching circuit that selects one out of:

a straight connection in which the True and Bar bit lines of a selected column bit line pair are connected to the True and Bar terminals of the sense amplifier, respectively; and a cross connection in which the True and Bar bit lines of a selected column bit line pair are connected to the Bar and True terminals of the sense amplifier, respectively.

According to the present invention, there is provided a control method of a semiconductor device comprising a memory circuit including a plurality of columns of bit line pairs, each bit line pair including True and Bar bit lines, between which at least a memory cell is connected and a sense amplifier that has True and Bar terminals and that performs differential amplification, wherein the method comprises:

storing a combination of the sense amplifier and the bit line having a predetermined operation limit, detected by a test, in a storage element, and based on information stored in the storage element, selecting one out of:

a straight connection in which True and Bar bit lines of a selected column bit line pair are connected to a True terminal and a Bar terminal of the sense amplifier, respectively; and a cross connection in which True and Bar bit lines of a selected column bit line pair are connected to the Bar terminal and the True terminal of the sense amplifier.

According to the present invention, since a semiconductor device is configured to avoid an occurrence of a combination in which cell current of a memory cell is worst, and an operation limit of a sense amplifier is worst, it is possible to suppress deterioration in yield rate and device characteristic, the deterioration being due to variations in transistors in the semiconductor device.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 2 is a flow chart illustrating procedures of operation in one exemplary embodiment of the present invention.

PREFERRED MODES OF THE INVENTION

Figure 1:
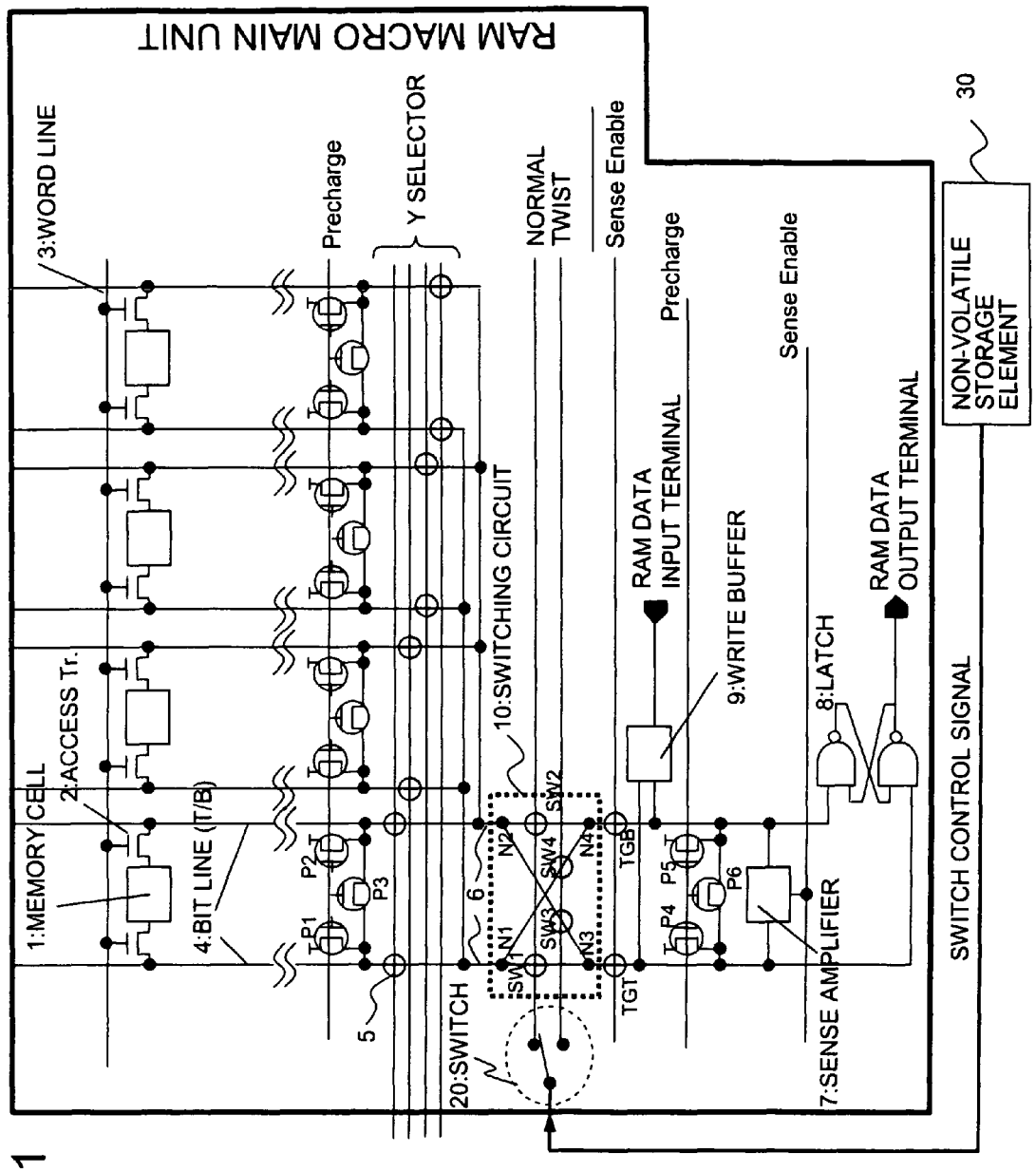
FIG. 1 is a diagram showing a configuration of one exemplary embodiment of the present invention.

In a static memory circuit in accordance with the present invention, data from a memory cell is read by amplifying difference voltage between True and Bar bit lines of a selected column. The static memory circuit includes a switching circuit (10) that selects either a True/Bar normal connection (straight connection), or a Bar/True reverse connection (cross connection), regarding the connection between True and Bar bit lines of a selected column and a sense amplifier in a portion where the True and Bar bit lines are connected to the sense amplifier.

In the static memory circuit according to the present invention, an IO line pair (6) including True and Bar IO lines is shared by a plurality of columns of bit line pairs, and a sense amplifier (7) that is connected to the IO line pair (6). One bit line pair of the selected column among a plurality of columns of bit line pairs is electrically connected to the IO line pair (6) via a column selection circuit (5) that corresponds to the bit line pair of the selected column and that is set in an on state. The switching circuit (10) is inserted on the IO line pair (6) between transfer switches (TGT, TGB) and connection nodes between the column selection circuits (5) of the plurality of columns and the IO line pair (6). The transfer switches (TGT, TGB) perform control of disconnecting the sense amplifier (7) from the bit line pair (4) of the selected column in association with operation of the sense amplifier (7). The switching circuit (10) is inserted on the IO line pair, more close to a bit line side than the connection nodes between the sense amplifier (7) and the IO line pair (6).

In the present invention, as a result of a test which is performed before product shipping to confirm function of the product, an associated flag is set on with respect to a sense amplifier for which an operation limit or operation margin is judged to be low or insufficient, and this flag information is written to the non-volatile storage element (for example, eFUSE (electrically programmable fuse) an so forth).

In one mode of the present invention, with regard to the product that has been shipped, when a power supply is started up, and before the product is used, the data written to the non-volatile storage element is supplied to the static memory circuit in the product, the switching circuit (10) in the static memory circuit performs connection switching of True and Bar bit lines, in correspondence with the sense amplifier for which the flag has been set on. After the connection switching for the bit line has been performed in abovementioned sequence, as long as the power supply is not turned off, it is possible to use the product while maintaining this state.

Figure 5:
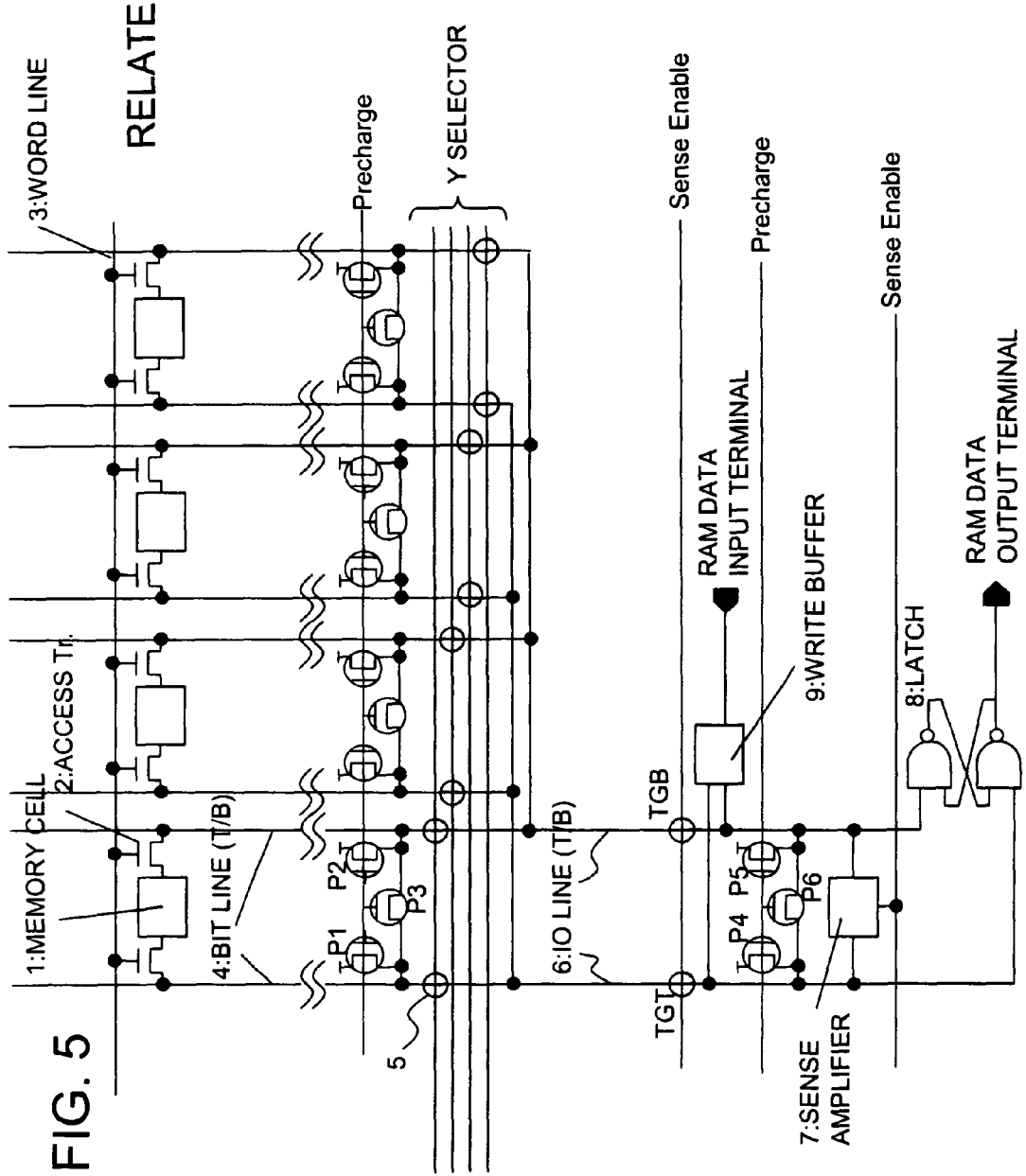
FIG. 5 is a diagram showing a configuration of a typical SRAM memory.
Figure 6:
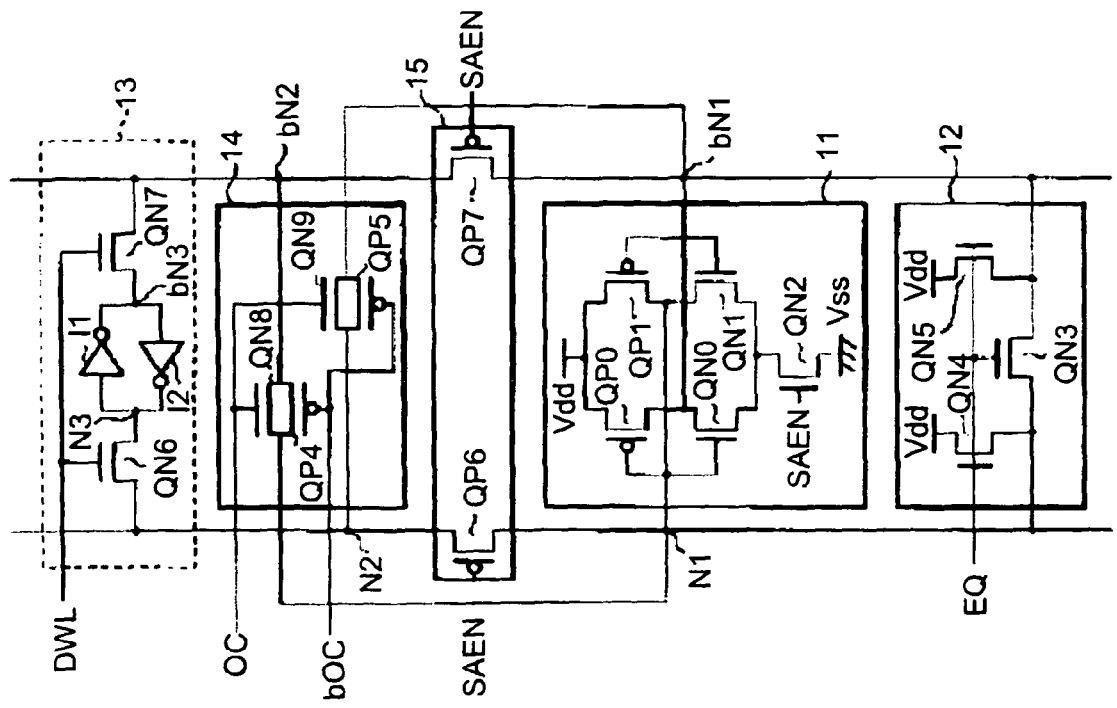
FIG. 6 is a diagram showing a configuration of Patent Document 2.

FIG. 1 is a diagram showing a configuration of one exemplary embodiment of the present invention. In FIG. 1, component elements the same as in FIG. 5 are given the same reference symbols. The overlapped description of the elements that are the same as in FIG. 5 will be omitted. Although there is no particular limitation imposed on the invention, in the present exemplary embodiment, a memory circuit is fabricated on an LSI chip, as a RAM macro main unit.

In the present exemplary embodiment, the memory circuit, similar to FIG. 5, includes a static memory circuit (RAM macro main unit) that includes a plurality of columns of True/Bar bit line pairs 4 and a differential type sense amplifier 7. In the present exemplary embodiment, a switching circuit 10 is provided in an IO line pair (T/B) 6 at a portion connecting the bit line pair 4 and the sense amplifier 7. The switching circuit 10 performs connection switching between a normal connection (straight connection) and a reverse connection (cross-connection) of the True and Bar bit lines, by a switch control signal NORMAL/TWIST. The switch control signal NORMAL/TWIST is given by data (flag information) written to a non-volatile storage element 30, such as eFUSE and so forth, disposed outside the static memory circuit (the RAM macro main unit). In the present exemplary embodiment the data (flag information) written to the non-volatile storage element 30 is supplied to input of a switch 20 as a switch control signal. When the switch control signal (flag information) from the non-volatile storage element 30 is High, for example, the switch 20 sets NORMAL to High, and switches SW1 and SW2 in the switching circuit 10 are set in an on state. At this time, the switch 20 set TWIST to Low, and switches SW3 and SW4 in the switching circuit 10 are set in an off state. As a result, a node N1 is connected to a node N3, a node N2 is connected to a node N4, and True and Bar bit lines 4 of a selected column are connected respectively to True and Bar terminals of a differential sense amplifier 7 (straight connection).

When a switch control signal of the non-volatile storage element 30 is Low, the switch 20 sets TWIST and NORMAL to High and Low, respectively, and the switches SW3 and SW4 are set in an on state, the switches SW1 and SW2 are set in an off state. As a result, a node N1 is connected to a node N4, a node N2 is connected to a node N3, and True and Bar bit lines 4 of the selected column are reversely connected to Bar and True terminals of the differential sense amplifier 7 (cross connection). In FIG. 1, the nodes N3 and N4 of the switching circuit 10 are connected to the sense amplifier 7 via transfer gates TGT and TGB that are turned on and off in common by an inverted signal of a Sense Enable signal. More specifically, transfer gates TGT and TGB are both turned off, when the Sense Enable signal is High, and are both turned on, when the Sense Enable signal is Low. The arrangement of the switching signal 10 and the transfer gates TGT and TGB on the IO lines 6 is not limited to the arrangement shown in FIG. 1. For example, a configuration is also possible in which the transfer gates TGT and TGB are disposed on the IO line (T/B) 6 between the node N1 and N2 side of the switching circuit 10 and column selection circuits (Y selector) 5.

In the present exemplary embodiment, the non-volatile storage element 30 and the switch 20 are provided as one set for the IO line (T/B) 6. In a static memory circuit that includes a plurality of IO lines (T/B) 6, a plurality of sets of the non-volatile storage elements 30 and the switches 20 are provided. In the present exemplary embodiment, the non-volatile storage element 30 is fabricated together with the RAM main unit macro on an LSI chip.

In the present exemplary embodiment, using the above-mentioned configuration, the static memory circuit is tested before product shipping, and as a result of the test, for a combination of bit line and a sense amplifier with a low operation limit, True and Bar bit lines 4 are connected to the sense amplifier 7 in a cross connection.

The static memory circuit of the present exemplary embodiment has the following advantageous effects.

Based on a result of the test of the memory circuit, by switching a circuit connection between the bit lines and the sense amplifier, operation margin of the memory circuit is improved and yield rate is improved. As described above, a worst read operation limit in the static memory circuit is determined by multiplication of cell current (current flowing in a drive transistor) of a memory cell and amplification capability of the sense amplifier. That is, when reading of data is performed in the sense amplifier and the memory cell with a combination such that amplification capability of the sense amplifier is worst and the cell current of the memory cell is worst, the operation limit point is lowest. The operation limit point for the entire memory circuit is restricted to a worst operation limit when the memory cell is worst and the sense amplifier is worst.

When fabrication process dependent random variations in transistors (especially adjacently placed transistors) are large, the performance (expressed by multiplication) of the memory cell and the sense amplifier is particularly worsened.

However, from some empirical rules or the like, the probability of an occurrence of a combination of a cell current of a memory cell being worst, and amplification capability of a sense amplifier being worst, can be said to be generally quite low.

With respect to a cell current of a memory cell, the probability is not high that a cell current of one node (for example, drive current of a drive transistor in a memory cell connected via an access transistor to a True bit line side) is worst, and a cell current of the other node (for example, drive current of a drive transistor in a memory cell connected via an access transistor to a BAR bit line side) similarly is worst.

It may also be said that with respect to a differential type sense amplifier, the probability is low that, when the operation limit of data read (amplification capability) of one side (for example, a True side) of the differential sense amplifier is low, the operation limit of data read (amplification capability) of the other side (for example, a Bar side) of the differential sense amplifier similarly is low.

Therefore, regarding a bit line (a bit line to which a worst cell current memory cell is connected) which corresponds to the combination in which a cell current of a memory cell is worst and amplification capability of a sense amplifier is worst, by interchanging True and Bar bit lines at connection nodes at which the bit line pair and the sense amplifier are connected, it becomes possible to avoid an occurrence of combination in which the cell current of the memory cell is worst and the amplification capability of the sense amplifier is worst.

As a result, according to the present exemplary embodiment, it can be anticipated that an effect due to the random variations in transistors will be reduced to improve the operation limit point of the memory circuit and yield rate.

In the cross-connected switching circuit 10, the node N1 is connected to the node N4 and the node N2 is connected to the node N3. Thus the Bar and True bit lines are reversely connected to True and Bar terminals of the sense amplifier 7. In addition, the Bar and True bit lines are reversely connected to differential outputs True and Bar output terminals of a write buffer 9. Accordingly, when writing data, data is differentially output from differential outputs (connected to True and Bar IO lines) of the write buffer 9 that receives write data from a RAM data input terminal to the Bar and True bit lines 4 of the selected column via the cross-connected switching circuit 10, and is written to the selected memory cell. When reading data that has been written to the memory cell, since signals of the True and Bar bit lines 4 are supplied via the cross-connected switching circuit 10 respectively to the Bar and True terminals of the sense amplifier 7 which performs differential amplification, the read data delivered to the RAM data output terminal has the same logic value as written data supplied from the RAM data input terminal to the write buffer 9.

FIG. 2 is a flow chart for describing a test procedure according to the present exemplary embodiment. With regard to the switching circuit 10 of FIG. 1, an operation test of the memory circuit is performed, in a normal state in which the True and Bar bit lines are in a straight connection, while gradually increasing voltage from a low power supply voltage (step S11). That is, data at a given power supply voltage is compared with a read data expected value after writing (write data) to perform a pass/fail judgment.

When an IO unit (a sense amplifier unit) having a combination of a sense amplifier and bit lines that fail even with a high power supply voltage, is detected, flag information indicating an on state (also termed as flag-on-information) is written to the non-volatile storage element 30 corresponding to the IO line (step S12). As described above, a plurality of non-volatile storage elements 30 are respectively provided for a plurality of IO lines 6, and according to a test result, flag information indication an on state is written to the non-volatile storage element 30 in correspondence with the IO line to which a column address that fails with a high power supply voltage is connected.

The flag information from the non-volatile storage element 30 is transmitted to the memory circuit (RAM macro main unit), and a bit line connection in the IO unit (sense amplifier unit) corresponding a failed portion is switched to a cross connection. In a state in which the bit line connection is switched to the cross connection, an operation confirmation test of the SRAM is performed once again. In cases of a pass in this way, it is confirmed that the operation limit is improved (step S13).

The flag information is kept stored in the non-volatile storage element 30 after product shipping. In a power-on sequence of the product, for example, the flag information of the non-volatile storage element 30 is transmitted to the memory circuit (RAM macro main unit), a switch control signal directing switching to a cross connection is transmitted to the switching circuit 10 of the IO line 6 corresponding to the non-volatile storage element 30 in which the flag information indication an on state is stored and in the switching circuit 10, switching of the bit line connection to the True/Bar cross connection is performed (step S21).

For the IO unit (sense amplifier unit) with a low operation limit, a state in which the connection of the bit lines True/Bar is interchanged is maintained while the power supply is on (step S22). As a result, it is possible to use a product in a state in which the operation limit has been improved.

Figure 3A:
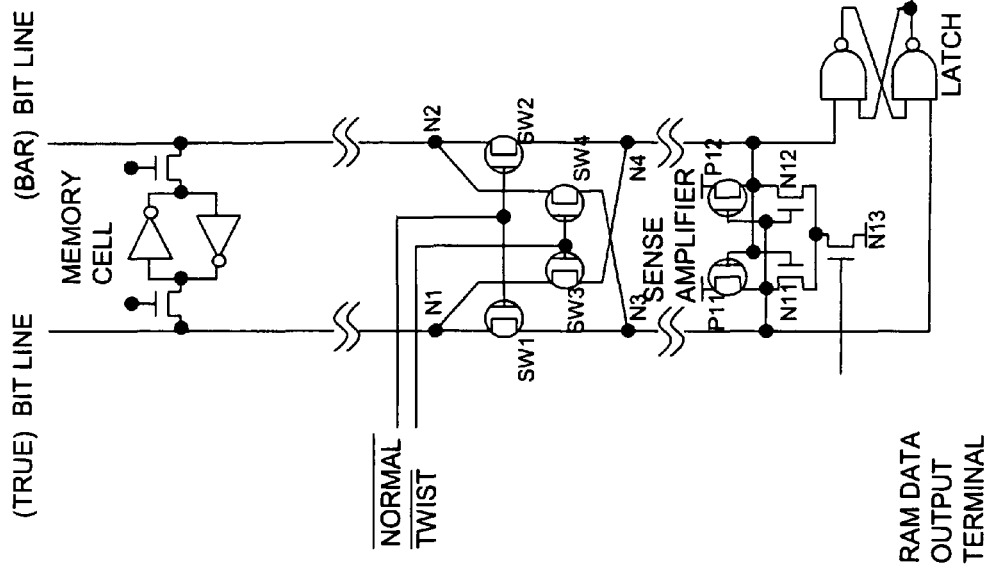
FIG. 3A and 3B are diagrams showing configurations of a switching circuit of FIG. 1.

FIG. 3 is a diagram showing specific examples of a configuration of the switch 10 of FIG. 1. In the example shown in FIG. 3A, respective switches SW1, SW2, SW3, and SW4 are composed by CMOS transfer gates (CMOS switches) including P-channel MOS transistors and N-channel MOS transistors. When a switch control signal NORMAL is High (TWIST is Low), the CMOS switches SW1 and SW2 are turned on, and the CMOS switches SW3 and SW4 are turned off. When a switch control signal NORMAL is Low (TWIST is High), the CMOS switches SW3 and SW4 are turned on and the CMOS switches SW1 and SW2 are turned off.

The sense amplifier includes NMOS transistors N11 and N12 that have sources coupled in common to a current source transistor N13, and PMOS transistors P11 and P12 that have sources connected in common to a power supply and drains connected to drains of the NMOS transistors N11 and N12, respectively. Coupled gates of the NMOS transistor N11 and the PMOS transistor P11 are connected to the coupled drains of the NMOS transistor N12 and the PMOS transistor P12 and also connected to a Bar IO line. Coupled gates of the NMOS transistor N12 and the PMOS transistor P12 are connected to the coupled drains of the NMOS transistor N11 and the PMOS transistor P11 and also connected to a True IO line.

Figure 3B:
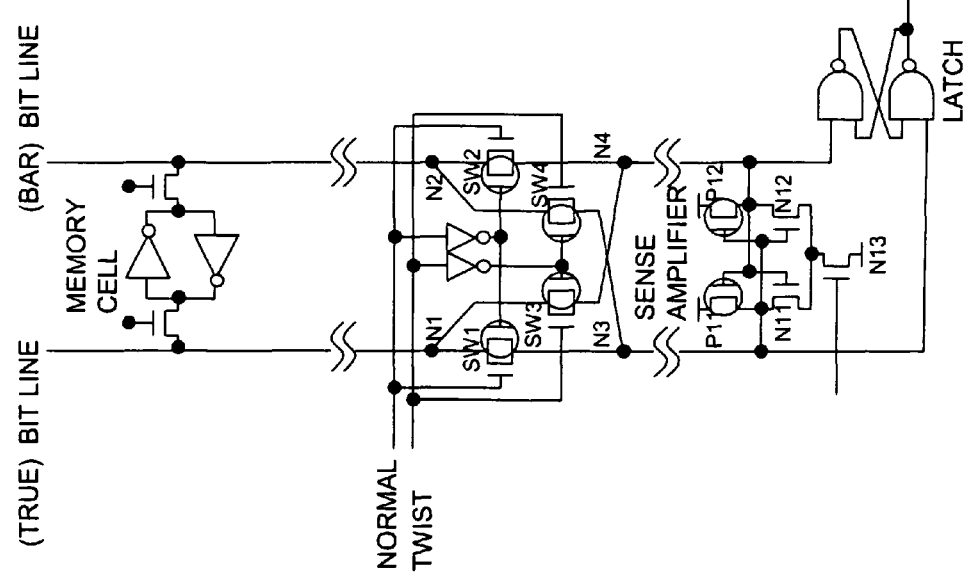

In the example shown in FIG. 3B, switches of SW1, SW2, SW3, and SW4 in FIG. 1 each are composed by PMOS transistors. When a switch control signal /NORMAL (inverted signal of NORMAL) is Low (/TWIST is High), the switches SW1 and SW2 are turned on, and the switches SW3 and SW4 are turned off. When the switch control signal /NORMAL is High (/TWIST is Low), the switches SW3 and SW4 are turned on, and the switches SW1 and SW2 are turned off.

Figure 4:
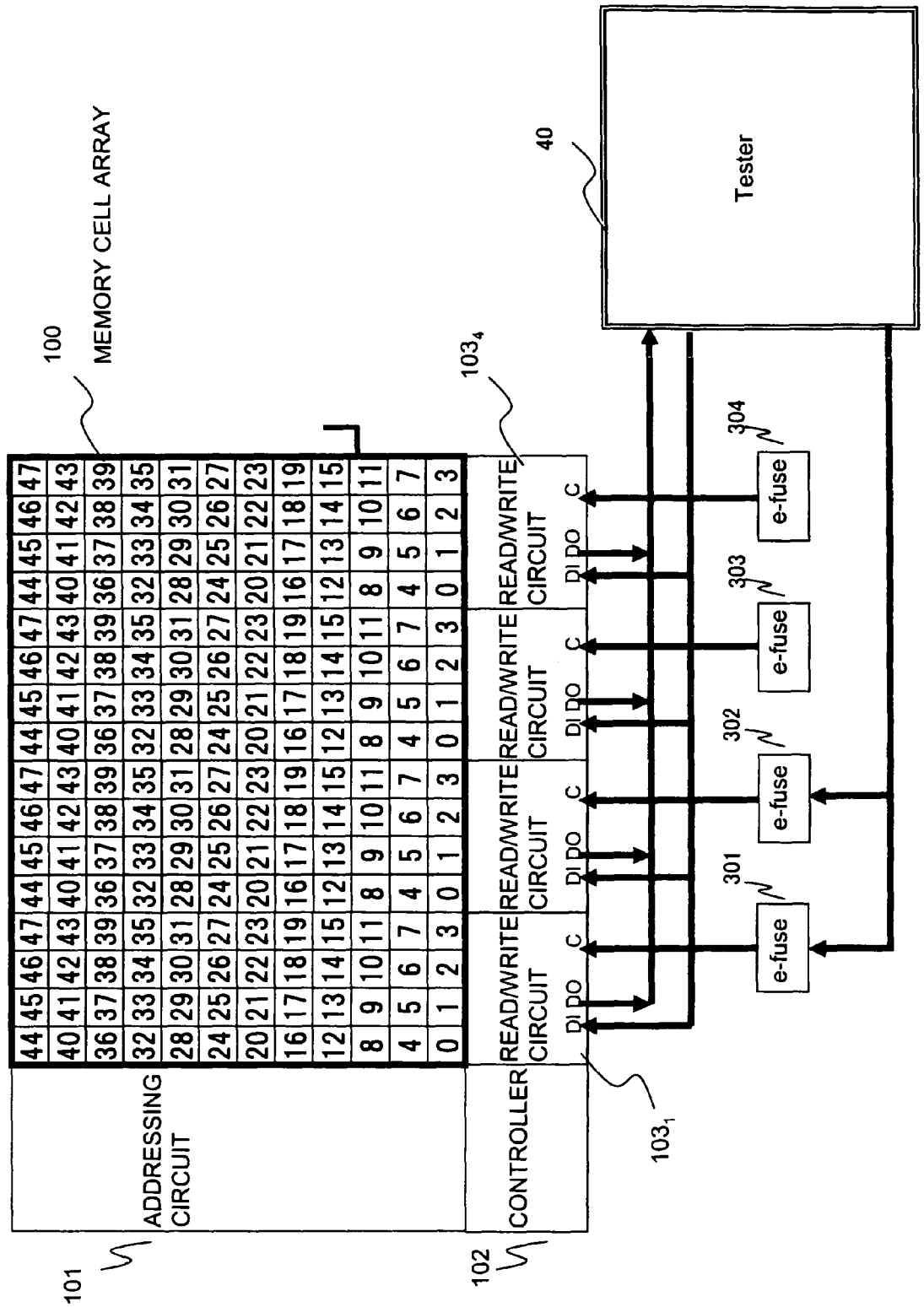
FIG. 4 is a diagram illustrating the present invention.

FIG. 4 is a diagram for describing execution of a test in one exemplary embodiment of the present invention. The memory circuit includes a memory cell array portion 100, an addressing circuit (row decoder, column decoder) 101, a control unit 102, and a read-write circuit (also referred to as an "IO unit") 103.

The read-write circuit (IO unit) 103 includes a switching circuit 10 connected to the IO lines 6 of FIG. 1, a sense amplifier 7, a latch 8, and a write buffer 9, a data input terminal DI (the RAM data input terminal of FIG. 1), a data output terminal DO (the RAM data output terminal of FIG. 1), and a control terminal C that receives a switch control signal. The non-volatile storage element (eFUSE) 30 of FIG. 1 is provided corresponding to each IO unit. In the example shown in FIG. 4, the memory cell array 100 includes 12 word lines, 16 bit lines (T/B), one IO unit (sense amplifier) for 4 columns (0, 1, 2, and 3), and 4 non-volatile storage elements (eFUSE) 30 for 4 IO units (sense amplifiers).

Based on a result of testing a SRAM memory before product shipping, a tester 40 writes flag-on information (information indication switching on, for example, logic one) to a non-volatile storage element 30 corresponding to an IO unit for which a sense amplifier operation limit is judged to be low, and based on the information stored in the non-volatile storage element 30, switching of bit lines connected to the sense amplifier in each IO unit is controlled. As for the product that has been shipped, when the power supply is up, the information stored in the non-volatile storage element 30 is transmitted to the SRAM memory, and a straight connection or cross connection of bit lines are controlled in each IO unit.

For example, assuming that among 4 columns connected to a read-write circuit (also referred to as "IO unit") $103_4$ at a right end of FIG. 4, it is judged that the operation limit of a bit line connected to a memory cell shown by address "47" is low, flag-on information is written by the tester 40 to the non-volatile storage element $30_4$. Based on the flag-on information stored in the non-volatile storage element $30_4$, the switching circuit 10 (refer to FIG. 1) inside the read-write circuit $103_4$ sets connection of the bit lines to a cross connection in which True and Bar bit lines 4 are cross connected to Bar and True IO lines 6 to which the sense amplifier 7 is connected. In this state, a test is performed once again. If the operation limit has been improved (if the test result passes), the product is shipped. In the read-write circuit $103_4$ of the product that has been shipped, based on the flag-on information written to the non-volatile storage element 304, the switching circuit 10 of FIG. 1 performs switching of the bit lines from a straight connection to a cross connection, and the product is operated in a state in which the True and Bar bit lines are reversely connected to the Bar and True IO lines 6 to which the sense amplifier 7 is connected. In this case, every True and Bar bit lines of the 4 columns connected to the read-write circuit $103_4$ provided at the right end of FIG. 4 are reversely connected to the sense amplifier 7 and the write amplifier 9. However, since the probability of cell currents of a memory cell for both True and Bar bit line sides being worst and amplification capability of a sense amplifier for both True and Bar IO line sides being worst, may be relatively low, the possibility may be considered low to observe a new occurrence of a column which was good until the connection of the True and Bar bit lines is switched to the reverse connection and whose operation limit is lowered by the reverse connection of the True and Bar bit lines.

In FIG. 4, instead of the tester 40, a test may also be performed by a BIST (Built In Self Test) not shown. The BIST circuit in the product that has been shipped, performs a test (Read-After-Write) with a prescribed operation frequency and power supply voltage and flag-on information may be set in the non-volatile storage element 30 that is programmable and that belongs to an IO unit that has failed.

The disclosures of Patent Documents 1 and 2 cited above are incorporated by reference in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor device comprising:
    a plurality of columns of bit line pairs, each bit line pair including True and Bar bit lines, between which at least a memory cell is connected;
    a sense amplifier that includes True and Bar terminals and that performs differential amplification;
    a switching circuit that selects one out of:
        a straight connection in which the True and Bar bit lines of a selected column bit line pair are connected to the True and Bar terminals of the sense amplifier, respectively, and
        a cross connection in which the True and Bar bit lines of a selected column bit line pair are connected to the Bar and True terminals of the sense amplifier, respectively; and
    an IO (input/output) line pair for the plurality of columns of bit line pairs, the IO line pair including True and Bar IO lines, the True and Bar terminals of the sense amplifier being connected to True and Bar IO lines, respectively, wherein:
        a bit line pair of a selected column among the plurality of columns of bit line pairs is connected to the IO line pair via a column selection circuit that is in an on state, and
        the switching circuit is arranged on the IO line pair between connection portions of the IO line pair and column selection circuits provided for the plurality of columns and connection nodes of the IO line pair and the True and Bar terminals of the sense amplifier.

2. The semiconductor device according to claim 1, further comprising a transfer gate pair that is inserted on the IO line pair, the transfer gate pair being on-off controlled to disconnect the sense amplifier from the bit line pair of the selected column, in association with operation of the sense amplifier,
    wherein the switching circuit is inserted on the IO line pair, between connection nodes of the transfer gate pair and the IO line pair and connection portions of the column selection circuits for the plurality of columns and the IO line pair, or between the connection nodes of the transfer gate pair and the IO line pair, and the connection nodes of the True and Bar terminals of the sense amplifier and the True and Bar IO lines of the IO line pair.

3. The semiconductor device according to claim 1, further comprising a write buffer that outputs write data differentially to the True and Bar IO lines of the IO line pair,
    wherein the switching circuit is inserted on the IO line between connection portions of the column selection circuits for the plurality of columns and the IO line pair and connection nodes of the differential outputs of the write buffer and the True and Bar IO lines of the IO line pair.

4. The semiconductor device according to claim 1, wherein the switching circuit comprises:
    a first and a second terminal respectively connected to the True and Bar IO lines of the IO line pair on a side of the connection portions of the IO line pair and the column selection circuits provided for the plurality of columns; and
    a third and a fourth terminal respectively connected to the True and Bar IO lines of the IO line pair on a side of the True and Bar terminals of the sense amplifier, and
    wherein based on a switch control signal received, in the straight connection, the first and second terminals are connected to the third and fourth terminals, respectively, and
    in the cross connection, the first and second terminals are connected to the fourth and third terminals, respectively.

5. The semiconductor device according to claim 4, further comprising:
    a first switch connected between the first terminal and the third terminal;
    a second switch connected between the second terminal and the fourth terminal;
    a third switch connected between the second terminal and the third terminal; and
    a fourth switch connected between the first terminal and the fourth terminal,
    wherein the first and second switches both are turned on in the straight connection and are turned off in the cross connection, based on the switch control signal, and
    wherein both the third and fourth switches are turned on in the cross connection and are turned off in the straight connection, based on the switch control signal.

6. The semiconductor device according to claim 4, further comprising a storage element that holds a value of the switch control signal.

7. The semiconductor device according to claim 6, further comprising a plurality of the storage elements provided in correspondence with a plurality of the IO line pairs, respectively.

8. The semiconductor device according to claim 6, wherein the storage element includes a non-volatile storage element that stores information on a combination of a sense amplifier and a bit line having a predetermined operation margin, detected by a test, and based on information stored in the non-volatile storage element, the True and Bar bit lines of the bit line pair of a selected column are connected either to the True terminal and the Bar terminal of the sense amplifier, respectively, or to the Bar terminal and the True terminal of the sense amplifier, respectively.

9. A control method of a semiconductor device comprising a memory circuit including a plurality of columns of bit line pairs, each bit line pair including True and Bar bit lines, between which at least a memory cell is connected, and a sense amplifier that includes True and Bar terminals and that performs differential amplification, the method comprising:

storing information on a combination of the sense amplifier and the bit line, in a storage element, the combination having a predetermined operation limit detected by a test;

based on the information stored in the storage element, selecting one out of:

a straight connection in which True and Bar bit lines of a selected column bit line pair are connected to the True terminal and the Bar terminal of the sense amplifier, respectively, and a cross connection in which True and Bar bit lines of a selected column bit line pair are connected to the Bar terminal and the True terminal of the sense amplifier;

detecting, by a test before product shipping, a combination of a memory cell and the sense amplifier, with a predetermined operation limit, and storing detected information in a non-volatile storage element;

transmitting, when a product is being operated after shipping, information stored in the non-volatile storage element to a memory circuit; and based on the information stored in the non-volatile storage element, either connecting True and Bar bit lines of a selected column bit line pair to a True terminal and a Bar terminal of the sense amplifier, or connecting True and Bar bit lines of the selected column bit line pair to the Bar terminal and the True terminal of the sense amplifier.

* * * * *